(12) United States Patent
Kosaka et al.

(10) Patent No.: US 8,836,096 B2
(45) Date of Patent: Sep. 16, 2014

(54) IMAGE SENSOR UNIT AND IMAGE SENSOR APPARATUS

(75) Inventors: Akira Kosaka, Yao (JP); Masataka Hamada, Osakasayama (JP); Satoshi Yokota, Toyonaka (JP); Yoshihiro Hara, Takatsuki (JP); Yasutaka Tanimura, Takatsuki (JP)

(73) Assignee: Konica Minolta Opto, Inc., Tokyo (JP)

( * ) Notice: Subject to any disclaimer, the term of this patent is extended or adjusted under 35 U.S.C. 154(b) by 155 days.

(21) Appl. No.: 13/398,468

(22) Filed: Feb. 16, 2012

(65) Prior Publication Data
US 2012/0146171 A1 Jun. 14, 2012

Related U.S. Application Data (62) Division of application No. 11/827,576, filed on Jul. 12, 2007, now Pat. No. 8,138,564.

(30) Foreign Application Priority Data

| Jul. 20, 2006 | (JP) | 2006-197858 |
| Jul. 21, 2006 | (JP) | 2006-199203 |
| Jun. 26, 2007 | (JP) | 2007-167465 |
| Jun. 26, 2007 | (JP) | 2007-167466 |

(51) Int. Cl.
*H01L 31/0232* (2014.01)
*H04N 5/232* (2006.01)
*H04N 5/225* (2006.01)
*H01L 23/00* (2006.01)
*H01L 31/0203* (2014.01)

(52) U.S. Cl.
CPC .... *H04N 5/23248* (2013.01); *H01L 2224/4827* (2013.01); *H01L 224/8592* (2013.01); *H01L 31/0232* (2013.01); *H04N 5/23258* (2013.01); *H01L 2224/48465* (2013.01); *H04N 5/2328* (2013.01); *H01L 31/0203* (2013.01); *H04N 5/2257* (2013.01); *H01L 2224/48091* (2013.01); *H01L 24/73* (2013.01)

USPC .......... 257/678; 257/E31.127; 257/114; 257/777; 257/E23.002

(58) Field of Classification Search
CPC .......... H01L 2224/48227; H01L 27/1464; H01L 27/14623; H01L 21/563; H01L 2924/18161; H01L 27/14818; H01L 33/52
USPC .......... 257/432, E31.127, 114, 777, 48, 257/E23.002; 438/48, 65, 109, 25
See application file for complete search history.

(56) References Cited

U.S. PATENT DOCUMENTS

| 2006/0092514 A1* | 5/2006 | Koo et al. ............ 359/557 |
| 2007/0071428 A1* | 3/2007 | Chen .................. 396/79 |
| 2007/0103264 A1 | 5/2007 | Yang |
| 2009/0212462 A1 | 8/2009 | Kruijt-Stegeman et al. |

* cited by examiner

FOREIGN PATENT DOCUMENTS

JP 2006-133730 5/2006

*Primary Examiner* — Cathy N Lam
(74) *Attorney, Agent, or Firm* — Cozen O'Connor (57) ABSTRACT

An image sensor unit includes a fixed substrate, a movable substrate, an actuate section including an actuator for moving the movable substrate against the fixed substrate, an image sensor having an imaging surface on a front surface of the image sensor, and at least, a part of a rear surface of the image sensor being directly fixed onto the movable substrate, an external electrical connecting member for conducting a transmission and reception of signals between the actuate section and the image sensor and an outside of the image sensor unit, and an internal electrical connecting member electrically connects the actuate section, the image sensor and the external connection wiring, wherein the actuate section, the image sensor, the internal connection wiring and a part of the external connection wiring are sealed into the same space.

13 Claims, 9 Drawing Sheets

IMAGE SENSOR UNIT AND IMAGE SENSOR APPARATUS

This is a Divisional of U.S. patent application Ser. No. 11/827,576, filed Jul. 12, 2007, now U.S. Pat. No. 8,138,564, which claims priority from Application No. 2006-197858 filed in Japan on Jul. 20, 2006; Application No. 2006-199203 filed in Japan on Jul. 21, 2006; Application No. 2007-167465 filed in Japan on Jun. 26, 2007; and Application No. 2007-167466 filed in Japan on Jun. 26, 2007. The disclosure of all of these patent applications are incorporated herein by reference.

FIELD OF THE INVENTION

This invention relates to an image sensor unit and an image sensor apparatus, particularly relates to an image sensor unit and an image sensor apparatus, in which an image sensor and an actuate section for moving the image sensor are provided.

BACKGROUND OF THE INVENTION

In recent yeas, due to the popularization of a digital camera and a cellar phone including a camera, miniaturization and a trend for high performance have been promoted. Even though, it is a small camera module, high functionalities, such as an auto-focus function, a zooming function and a correction function of camera shake have become necessary functions. In accordance with this trend, a small size actuator for moving a lens or an image sensor is required. Further, in the usage for correcting the drive of an optical pickup for recording and reproducing information onto or from DVD, the miniaturization of the actuator has been following on a course of miniaturization.

With respect to a small size actuator, which has been rapidly progressed in recent years, for example, a linear actuator including a piezoelectric element as a drive source (SIDM: Smooth Impact Drive Mechanism), a string style shape memory alloys (SMA: Shape Memory Alloys) and further a polymer actuator can be listed.

Among those items listed above, an electro static actuator using a micro processing technique, to which an integrated circuit technology called MEMS (Micro Electro Mechanical System) has bee applied, has gathered attentions. For example, Japanese Patent Application Publication Open to Public Inspection No. 2006-133730 has disclosed a method for correcting the camera shake by moving an image sensor by using a compactly shaped electro static actuator.

However, according to the method disclosed in Japanese Patent Application Publication Open to Public Inspection No. 2006-133730, the structure is arranged as following. The image sensor is placed in a sensor package; the sensor package is attached onto a flexible board; the flexible board is placed on a camera shake correction mechanism structured by the comb shaped electro static actuator. Since the image sensor, the sensor package, the flexible board and the electro static actuator are independently manufactured, the object to be driven by the electro static actuator becomes large and heavy. Accordingly, the electro static actuator securing the force power inevitably becomes large, which is not suitable for the parts to be installed into a small size camera module and an optical pickup.

Further, any countermeasure against foreign objects of the electro static actuator has not been disclosed. However, the countermeasure against foreign objects is a necessary item for the comb shaped electro static actuator and the total electro static actuator section needs to be, shield. As a result, there is a problem that the size of the camera shake correction apparatus further becomes large.

In general, there are following problems to miniaturize an actuator. 1) Lowering driving load (mass of an object to be driven, friction of a mechanism, electric wiring and a convection current. 2) Simplifying assembly. 3) Lowering foreign objects. Those will be described below.

1) In general, a generated force becomes low as the size of an actuator becomes small. For example, with respect to the camera shake correction mechanism, which is a type for moving an image sensor, the lightest weight of the image sensor unit, which is an object to be moved, is about 3 g. In addition to this, when adding the friction of a mechanism, the load of a spring and the load of a flexible board for transmitting the electric signals from the image sensor to the outside, the load becomes about of 0.1N.

The volume of the actuator for driving those loads becomes about 300 $mm^3$, which is considerably a large size. Since this size is fatal for an actuator for driving a small size camera unit and an image sensor unit of an optical pickup, it is necessary to lower the weight and load of the image sensor unit.

2) For example, in the camera shake correction mechanism, which is a type for moving an image sensor, which has been currently established, the total number of parts, which structure an actuator and the correction mechanism, is about 20, and the number of parts, which connect parts each other, is also about the same number. Taking account that applying this to a small size camera unit and an optical pickup, it is difficult to realize the contact with high accuracy in a short time period based on the extension of the conventional technique. It is necessary to make an improvement to realize it.

3) As described above, the most widely and publicly known actuator as a micro size actuator is an electro static actuator. However, for example, in the case of the comb teeth type electro static actuator, which has been described above, since the interval between a fixed comb tooth and a movable comb tooth is several μm, which is very narrow, in order to secure an operation, it is mandatory to use a sealing structure to prevent foreign objects, whose size is in a degree of several μm, from entering into the mechanism.

SUMMARY OF THE INVENTION

An object of this invention is to provide an image sensor unit and an image sensor apparatus, which are suitable for being installed into a compact size camera module and an optical pickup, which are also small sized, light weighted, easily assembled and hard to be influenced by foreign objects, based on the facts described above.

An object of the present invention can be attained by the following configuration.

An image sensor unit includes a fixed substrate, a movable substrate, an actuate section including an actuator for moving the movable substrate against the fixed substrate, an image sensor having an imaging surface on a front surface of the image sensor, and at least, a part of a rear surface of the image sensor being directly fixed onto the movable substrate, an external electrical connecting member for conducting a transmission and reception of signals between the actuate section and the image sensor and an outside of the image sensor unit, and an internal electrical connecting member for electrically connecting the actuate section and the image sensor to the external electrical connecting member, wherein the actuate section, the image sensor, the internal electrical connecting member and a part of the external electrical connecting member are sealed into the same space.

BRIEF DESCRIPTION OF THE DRAWINGS

FIGS. 6 (a), (b) and (c) illustrate schematic diagrams showing a second embodiment of the actuate section.

FIGS. 7 (a) and (b) illustrate schematic diagrams showing a third embodiment of the actuate section.

PREFERRED EMBODIMENT OF THE INVENTION

An embodiment of the present invention will be described based on drawings. This invention is not limited to this embodiment. In the figures, the same number is used to the same or equivalent section and duplicated explanation will be omitted.

Figure 1:
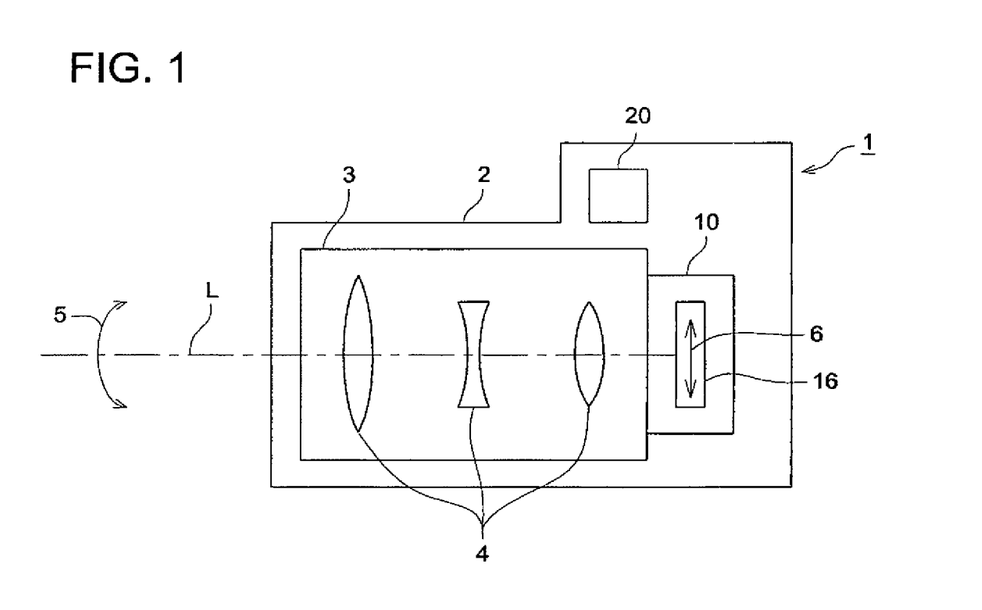
FIG. 1 illustrates a schematic diagram showing a configuration of a digital camera and a camera shake correction device, and a principle of the camera shake correction.

Firstly, a digital camera, which is an example of an image sensor apparatus of the present invention, will be described by using FIG. 1. FIG. 1 illustrates a schematic diagram showing a configuration of a digital camera and a camera shake correction device, and a principle of the camera shake correction.

As shown in FIG. 1, a camera shake correction device 10 is installed in a digital camera 1 and used. A camera main body 2 and an barrel 3, which is an optical system including photographic lenses 4 configure the digital camera 1. A camera shake correction device 10, as described in FIG. 2 and onward, includes an image sensor, such as CCD, and is attached on the edge of the barrel 3.

When a camera shakes, for example, up and down, due to a camera shake while photographing, and the optical axis L of light entering into the barrel 3, shifts up and down as shown by an arrow sign 5, a camera shake sensor 20, such as a gyro 10, detects the camera shake. An image sensor 16 moves up and down in a direction as shown by an arrow sign 6 to correct the deviation of the optical axis L. The horizontal direction deviation, can be corrected by the same way. A camera shake correction device 10 works as an image sensor unit in this invention.

Figure 2:
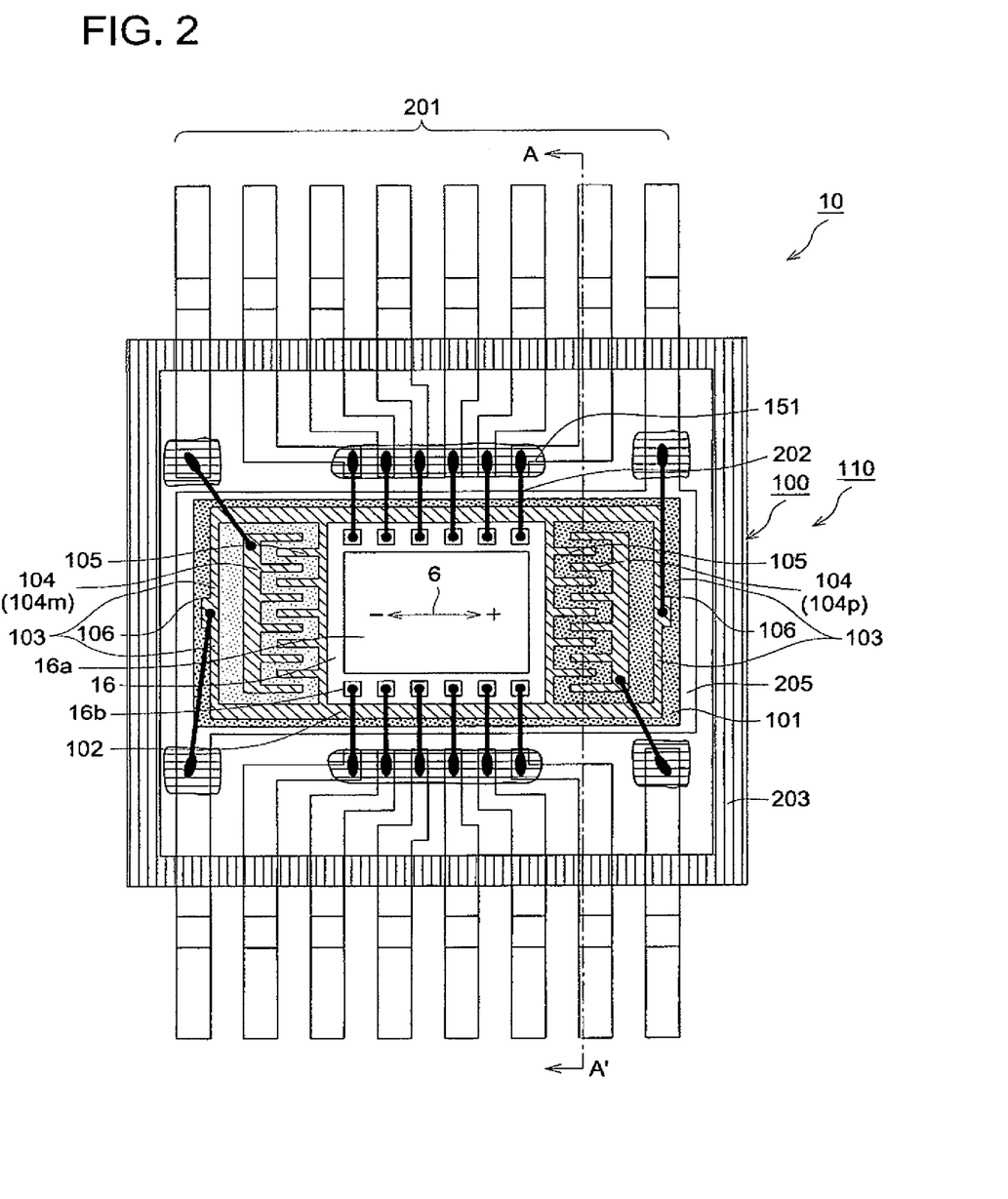
FIG. 2 illustrates a schematic diagram of the camera shake correction device viewed from an optical axis side.
Figure 3:
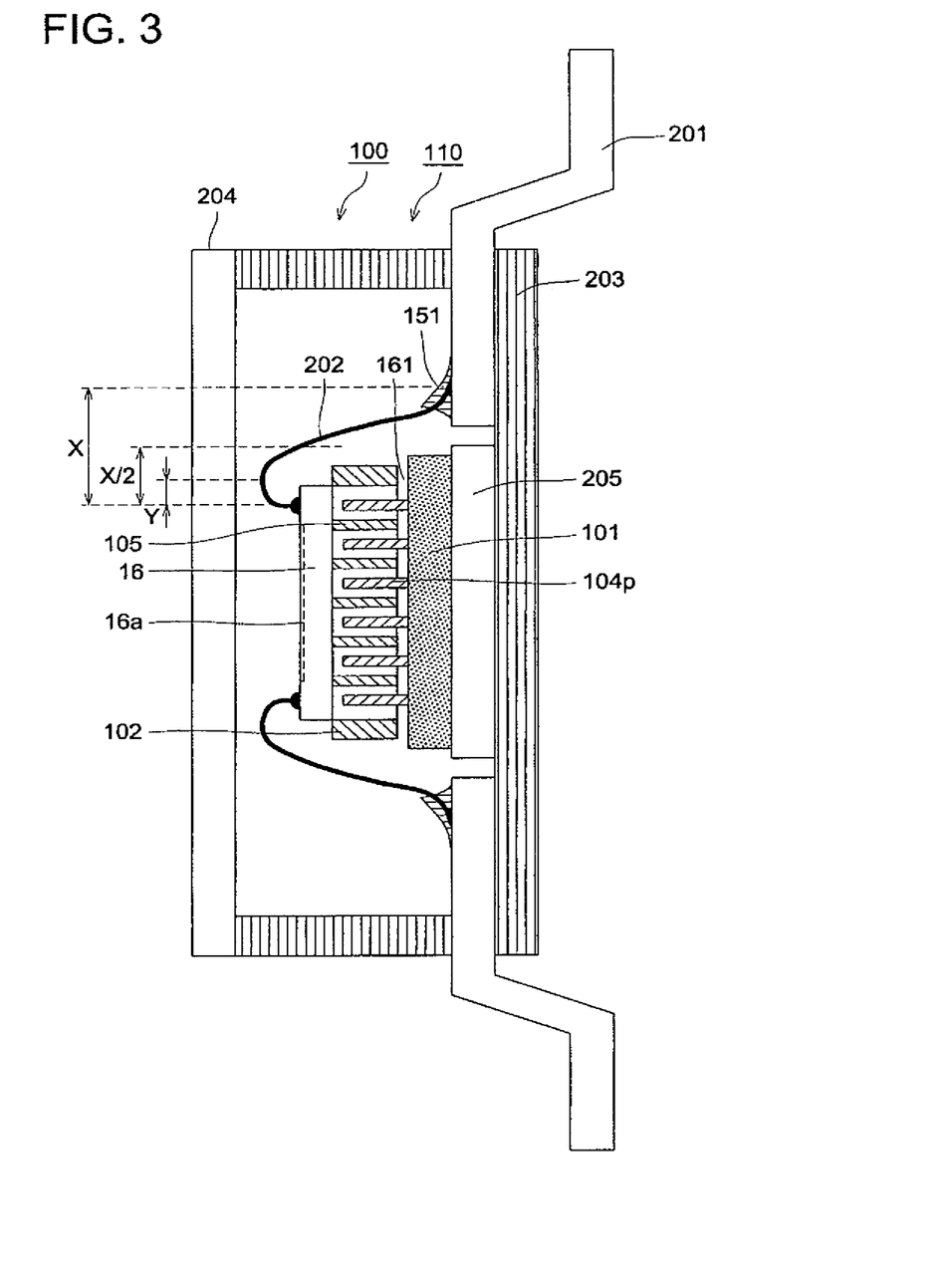
FIG. 3 illustrates a schematic cross sectional view of the camera shake correction device by cutting the camera shake correction device at A-A' cross section of FIG. 2.

Next, a first embodiment of the actuate section 100, which is a main portion of the camera shake correction device 10, will be described by using FIGS. 2-5. Firstly, a configuration of the camera shake correction device 10 will be described. FIG. 2 illustrates the schematic diagram of the camera shake correction device 10 viewed from an optical axis L side. FIG. 3 illustrates the schematic cross sectional view of the camera shake correction device 10 by cutting the camera shake correction device 10 at the A-A' cross section of FIG. 2.

In FIGS. 2-3, the camera shake correction device 10 comprises an image sensor 16, an actuate section 100, a die-frame 205, a lead frame 201, a package 203 and a protective glass 204. In addition, the lead frame 201 serves as the external electrical connecting member of the present invention, and the external electrical connecting member includes a lead frame, and a connection wiring which is pattern-wired on the package, passing through an interior to an exterior terminal.

In a first embodiment, the actuate section 100 comprises a fixed substrate 101, a movable substrate 102 and a comb shaped actuator 110. The actuator 110 is structured by a fixed comb 104 fixed on a fixed substrate 101, and a movable comb 105 formed into one body together with a movable substrate 102, a beam 103 and a beam fixing section 106, which is structured by a MEMS technique, which has been described above based on, for example, silicon (Si).

The MESM technique denotes a field for manufacturing a micro sensor, an actuator and an electro mechanical structural member of a unit of μm by using a micro machining technique, to which an integrated circuit technologies have been applied. The micro machine manufactured by the micro machining technique can realize the size, which is equal to or less than mm and the accuracy, which is equal to or less than μm. As shown in FIG. 2, since the complicated structure, such as a comb shaped structure having a zigzag structure, can be manufactured with a high accuracy on an integrated process at once, cost can be lowered and an adjusting process is not necessary.

In a first embodiment, for example, a silicon oxide film ($SiO_2$) called a sacrificial layer is selectively layered onto the fixed substrate 101, which is formed by silicon (Si); a structural layer formed by silicon (Si) having a conductivity, into which extrinsic material has been doped with high concentration, is further layered thereon; the structural layer is etched to make the movable substrate 102, the beam 103, the fixed comb 104, the movable comb 105 and the beam fixing section 106 at the same time; and the sacrificial layer is removed by a sacrificial layer etching to form a state where the movable substrate 102, the beam 103 and the movable comb 105 are floated from the fixed substrate 101.

Namely, there is a state where a space between the group of movable substrate 102, the beam 103 and the movable comb 105, and the fixed substrate 101 is formed. The movable substrate 102, the beam 103 and the movable comb 105 are in a floating state, which is fixed onto the fixed substrate 101 by the beam fixing section 106, which is formed in the center of the beam 103. The fixed substrate 101 is fixed onto a die-frame 205 by an adhesive agent.

With respect to the sacrificial layer etching technique, the detail has been described, for example, in Toyota Central Research Laboratory "Sacrificial Layer Etching Technique for MEMS".

The fixed comb 104 and the movable comb 105 are structured into a comb tooth shape having a zigzag structure. The movable comb 105 is arranged to move in the directions of an arrow sign 6 in FIG. 2 based on the force power generated between the fixed comb 104 and the movable comb 105. The operation based on the electric field applied on the fixed comb 104 and the movable comb 105 will be described by using FIG. 5.

The image sensor 16 is manufactured based on silicon (Si) as a main material by the semiconductor manufacturing process. An imaging surface 16a and bonding pads 16b are provided on the surface of the image sensor 16, which is provided on the movable substrate 102 of the actuate section 100 manufactured by the MEMS technique described above. The rear surface of the imaging surface 16a of the image sensor 16 and the front surface of the movable substrate 102 are directly contacted by the direct contact technique.

The direct contact technique denotes a contact method without using an adhesive agent, which is a contact method utilizing a surface tension generated between the same materials, which is superior in the strength after contact, less distortion and declination, simplicity of contact and space saving. In this example, since the movable substrate 102 and the image sensor 16 are formed based on silicon, contact by the direct contact technique is available and the merits described above can be enjoyed. Detailed information of the direct contact technique is described, for example, in "Wafer direct contact technique" National Institute of Advanced Industrial Science and Technology.

A bonding wire 202 is bridged between the bonding pads 16b of the image sensor 16 and the lead frame 201, to transmit signals from the image sensor 16 to the lead frame 201. The bonding wire 202 also bridged between the fixed comb 104 and movable comb 105 and the lead frame 201 to apply electric field between the fixed comb 104 and the movable comb 105. In addition, the bonding wire 202 serves as the internal electrical connecting member of the present invention, and the internal electrical connecting member includes a bonding wire, a member which is connected to the flexible board from a bump, and a pattern-wiring formed on a drawn beam which is integral molded with an image sensor, in which MEMS technology is used.

Soldering the lead frame 201 onto a circuit board (not shown) allows the image sensor 16 to transmit and receive image signals and signals for applying electric field to the fixed comb 104 and the movable comb 105.

With respect to the bonding wire 202, wire formed of Gold (Au) or Aluminum (Al) having a diameter of several tens μm (for example, 25 μm or 15 μm) is used. The example of wire shown in FIGS. 2-3, is wire formed by Gold (Au). In general, in many cases, the method of pushing and connecting the wire of Gold (Au) in the bonding pads 16b side of the image sensor 16, which has been formed into a ball shaped state by being melted by heat, which is called a ball bond, onto the bonding pads 16b, is used; and the method of rubbing and connecting the wire of Gold (Au) of the lead frame 201 side, which is called stitch bond, onto the lead frame 201 while applying ultra sound wave.

The bonding wire 202 is drawn in the up and down directions of the camera shake correction device, namely drawn in the up and down directions of FIG. 2 when the digital camera 1 shown in FIG. 1 is in a state where the digital camera 1 is placed in a front surface stand up state. Based on this arrangement, by utilizing a spring characteristic of bonding wire 202, it becomes possible to decrease the deviation between the center of imaging surface 16a of the image sensor 16 and the optical axis L (so called center offset) caused by the mass of a movable portion of the image sensor 16 and the movable substrate 102.

Further, by drawing the bonding wire 202 in the direction, which is perpendicular to the moving direction of the image sensor 16 as described above, rather than drawing the bonding wire 202 in the same direction of the movement of the image sensor 16, the accumulation of distortion and metal fatigue caused by the swing of the bonding wire 202 due to the movement of the image sensor 16 can be further decreased.

Further, in order to balance the loads generated by the bonding wire 202 when moving the image sensor 16, the spring characteristics in both sides, which are a side where the spring is pressed and the other side where the spring is pulled. In order to balance the spring characteristics of bonding wire 202, the number of bonding wires 202, the length, the diameter, the angle formed by drawing or synthesized force thereof should be equal to each other.

Further, in a camera shake correction operation, the moving amount of the image sensor 16 may be different case by case based on the condition of the field angel of the photographic lens 4 and the pixel size of the image sensors. However, the moving amount of the image sensor 16 is about several tens μm to several hundreds μm. Since the image sensor 16 moves in the arrow sign 6 direction against the lead frame 201 along with the camera shake correction operation, it is necessary to prevent the bonding wire 202 from being snapped.

In order to realize this, it is preferable that the peak of wire in the height direction, after bonding the bonding wire 202 onto the bonding pads 16b of the image sensor 16, is arranged to be positioned near the image sensor 16 (for example, as shown in FIG. 3, a peak position Y is arranged to be less than a half of the distance X, which is a distance between the bonding pads 16b of the image sensor 16 and the bonding position on the lead frame 201 being a lead frame). It is also preferable to stretch the bonding wire 202 so that the bonding wire 202 is loosed with a length, which is equal to or more than a half of a maximum moving length of the image sensor 16.

Further, as described above, there is a possibility that breaking of the bonding wire 202 caused by the fatigue and bonding-off may occur by repeating the movement of the image sensor 16. Particularly, since the stitch bond in the lead frame 201 side includes much more distortion due to the stress caused when bonding, which is more than that of the ball bonding of the bonding pads 16b side, the possibility of occurrence of wire breaking or bonding-off seams to be high. In order to avoid these problems, as shown in FIGS. 2-3, it is preferable that a potting of silicon resin is applied onto the bonding section of the lead frame 201 side to increase the strength of the bonding portion.

Respective elements of the camera shake correction device 10 described above, in practice, the actuate section 100, the image sensor 16, the die-frame 205, the lead frame 201 and bonding wire 202 are sealed in the space formed by the package 203 and protective glass 204 except a part of the die-frame 205 and the lead frame 201. The assembly of the camera shake correction device 10 is conducted, for example, in a clean room or a clean bench. Accordingly, there may be no invading of foreign objects into the space formed by the package 203 and the protective glass 204. Thus, it becomes possible to protect the actuate section 100 and the image sensor 16 from foreign objects.

Since a convection current of the air becomes zero by the sealing, it becomes possible to decrease the dispersion of the load caused by the convection current of the air in the acetate section 100.

Figure 4:
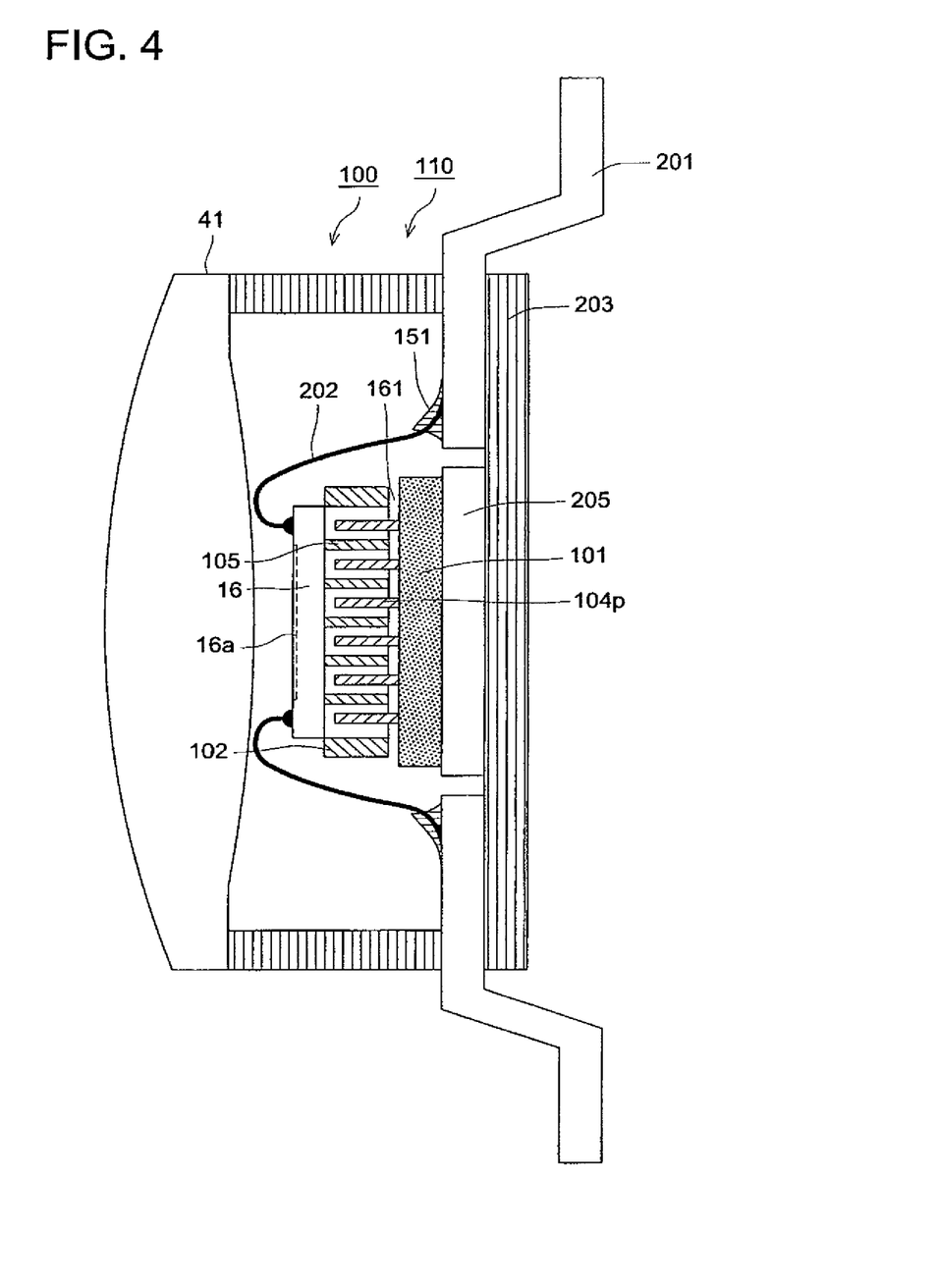
FIG. 4 illustrates the other schematic cross sectional view of the camera shake correction device by cutting the camera shake correction device at A-A' cross section of FIG. 2.

In this example, as shown in FIG. 3, the protective glass 204 keeps the sealing of the image sensor 16 and the actuate section 100. However, as shown in FIG. 4, instead of the protective glass 204, a lens 41 serving as an optical member, which is located at the nearest position to the image sensor 16 among respective lenses, which form the photographic lens 4 may keep the sealing.

Figure 5:
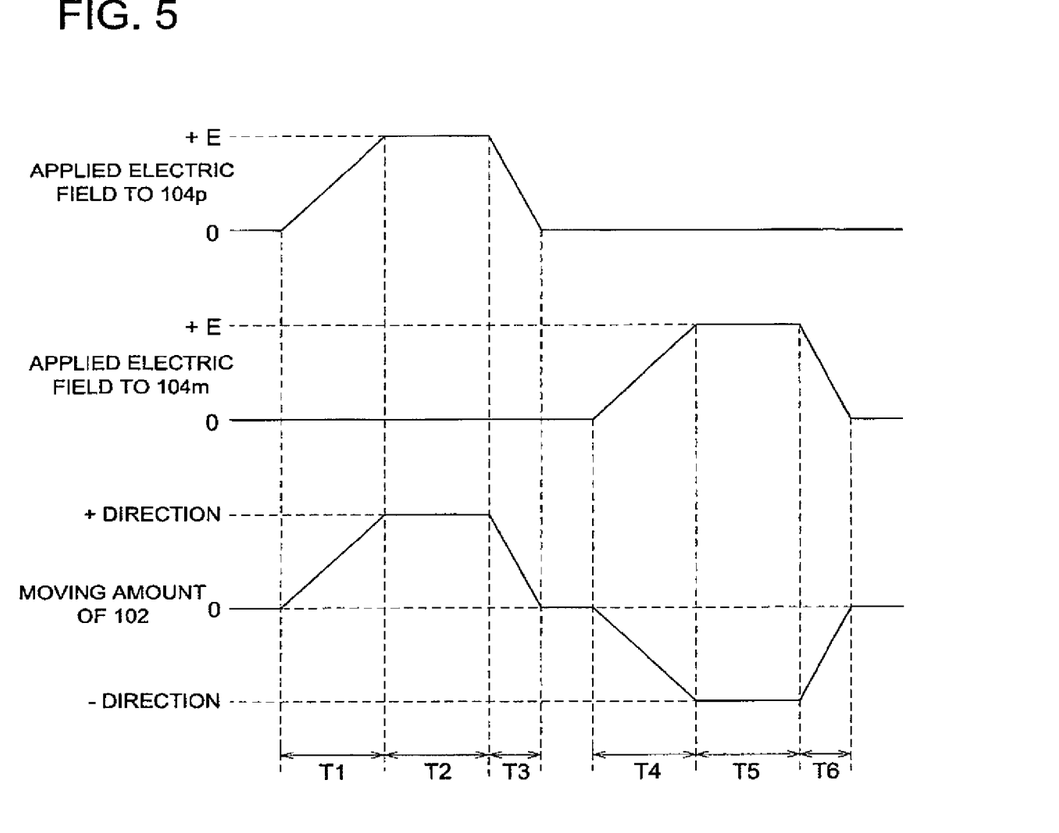
FIG. 5 illustrates a timing chart showing an example of a driving method of an electro static actuator in a first embodiment of the actuate section.

Next, the operation of the camera shake correction device 10 will be described. FIG. 5 illustrates the timing chart showing an example of a driving method of an electro static actuator in a first embodiment.

In FIGS. 2 and 5, the fixed comb 104 positioned in the + side of the arrow sign 6 is defined to be a + side fixed comb 104p, and the fixed comb 104 positioned in the − side of the arrow sign 6 is defined to be a—side fixed comb 104*m*. A beam fixing section 106 is connected to lead frame 201 formed into one body together with a die-frame 205 by bonding and is grounded at the outside of the package.

At the time T1 as shown in FIG. 5, when applying the electric field of +E to the + side fixed comb 104*p*, a pull force caused by the electro static power between +side fixed comb 104*p* and the movable comb 105 is generated and the movable comb 105, namely, the movable substrate 102 moves in the + direction of the arrow sign 6. At this moment, the beam 103, the center portion of which is fixed onto the fixed substrate 101 by the beam fixing section 106, is bent. Based on this fact, it is assured that the beam 103 only moves in the arrow sign 6 direction of the movable substrate 102. Namely, the movable substrate 102 fully translates in the + direction but does not move in a direction perpendicular to the arrow sign 6 direction.

When maintaining the electric field applied to the + side fixed comb 104*p* at +E as the timing T2, the movable substrate 102 stops based on the balance between the pull force generated by the electro static force and the bending force of the beam 103. At the timing T3, when stopping the application of the electric field to the + side fixed comb 104*p*, the pull force of the electro static force becomes zero and the movable substrate 102 returns to the original position by the righting force of the beam 103.

Next, at the timing T4, when applying the electric field +E to the − side fixed comb 104*m*, the pull force occurs between the − side fixed comb 104*m* and the movable comb 105, and the movable comb 105, namely the movable substrate 102, moves in the − direction of the arrow sign 6. At this moment, since the beam 103 bends, it is assured that the beam 103 moves only in the arrow sign 6 direction.

When maintaining the electric field applied to the − side fixed comb 104*m* at +E as timing T5, the movable substrate 102 stops because of the balance between the pull force of electro static force and the bending force of the beam 103. At timing T6, when stopping the application of the electric field to the − side fixed comb 104*m*, the pull force of the electro static force becomes zero and the movable substrate 102 returns to the original position by the righting force of the beam 103.

Namely, the camera shake correction device can correct image degradation due to the camera shake by applying an electric field to the fixed comb in the direction, to which the movable substrate 102 needs to be moved, and can return the movable substrate 102 to the original position by the righting force of the beam 103 by stopping the application of the electric field.

In a first embodiment, in order to make the description simple, the structure where the movable substrate 102 can move only in the arrow sign 6 directions (left and right directions in FIG. 2) has been shown. However, the movable substrate 102 can be moved in directions, which is perpendicular to the arrow sign 6 directions (up and down directions in FIG. 2) by disposing the same structure between the fixed substrate 101 and the die-frame 205.

Further, in a first embodiment, the portion of the movable substrate 102 facing to the rear surface of the image sensor 16 is contacted with the image sensor with a full surface. However, by limiting the full surface contact to a partial contact and providing the beam 103, the fixed comb 104 and a part of the movable substrate 105 on a portion of the surface facing to the rear surface of the image sensor 16, the projection area viewed from the optical axis L side can be further minimized than that of one shown in FIG. 2. An example where the whole actuate section 100 is structured on the rear surface of the rear surface of the image sensor 16 by further expanding this idea will be described by using FIG. 6 later.

Further, in a first embodiment, the actuate section 100 is to be structured by Silicon (Si) as a main material by using MEMS technique. However, the manufacturing mythology is not limited to this. For example, the actuate section 100 may be structured by applying a micro-accuracy formation onto a plastic material and applying a conductive processing on it, or may be structured by applying a micro-accuracy formation on a conductive plastic:

As described above, the camera shake correction device 10 corrects the deviation of the optical axis L by moving the image sensor 16 placed on the movable substrate 102 by controlling the electric field applied between the fixed comb 104 and the movable comb 105 according to the vibration amount and the rate of the digital camera 1 detected by the camera shake sensor 20 installed in the digital camera 1.

As described above, according to a first embodiment, by manufacturing the actuate section by applying MEMS technique, plural actuate sections having complicated structure can be manufactured on an integrated process at once with high accuracy. Further, this manufacturing is less expensive and no adjustment process becomes necessary. Since the image sensor and the actuate section can be connected without a package and a printed circuit board, the actuate section can be minimized. Further, an image sensor unit, which is suitable for the installation into a small size camera module and an optical pickup, small sized, easy to manufacture and free from influence of foreign objects, can be provided.

Further, by sealing the image sensor and the actuate section into the same package, foreign objects can be rejected. Further an image sensor unit and an image sensor apparatus, which are suitable for the installation into a small size camera module and an optical pickup, small and light weighted, easy to assemble and free from influence of foreign objects, can be provided. Further, since the drive of the actuate section is only to apply an electric field, it is easy to control the camera shake correction device.

In addition, breaking of the bonding wire can be prevented by working out the way of drawing the bonding wire, the way of loosing the bonding wire and the reinforcement by the potting on the bonding section; directly placing the image sensor on the actuate section; and sealing the image sensor and the actuate portion into the same package, which participates the improvement of the quality.

Figure 6:
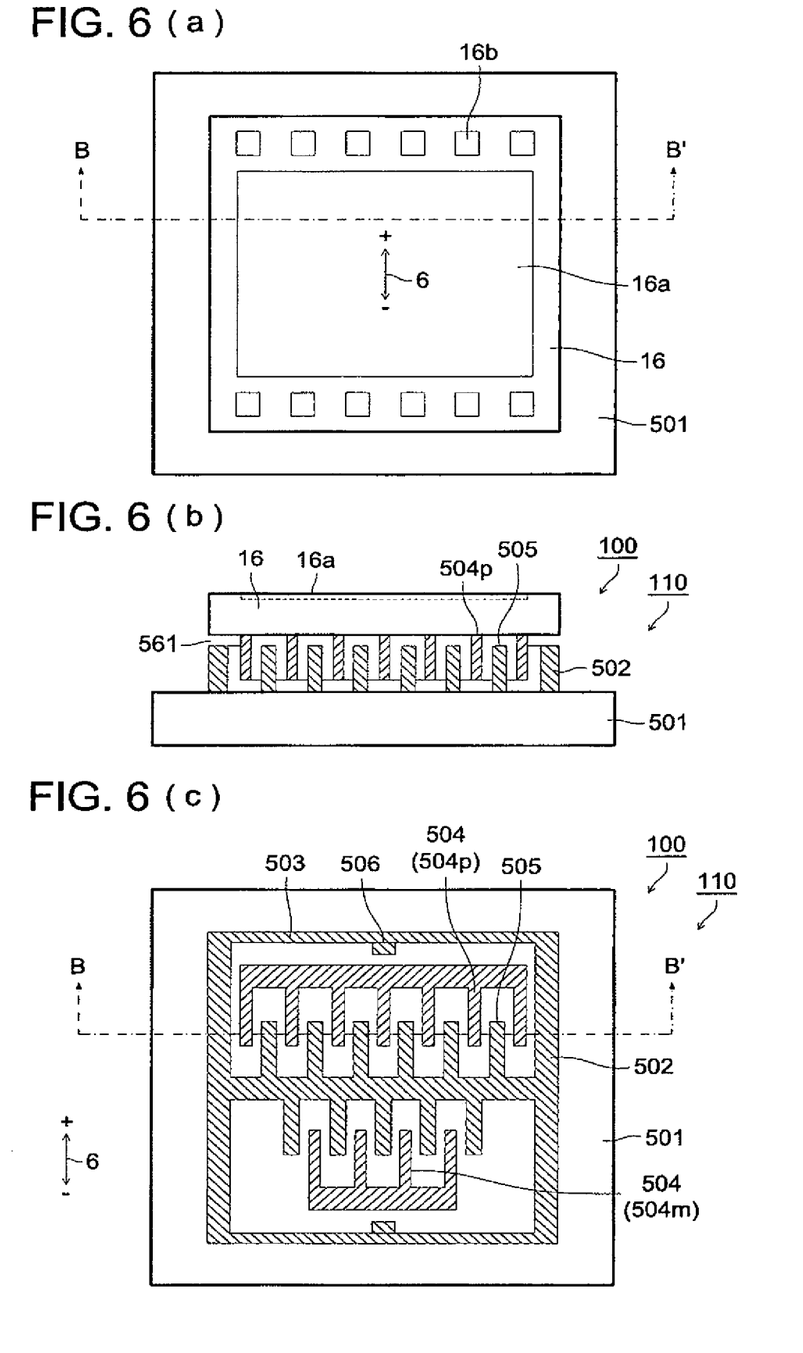

Next, a second embodiment of the actuate section 100 will be described by using FIG. 6. FIG. 6 illustrates a schematic diagram showing a second embodiment. FIG. 6(*a*) illustrates a schematic diagram showing the actuate section 100 viewed from the optical axis L side. FIG. 6(*b*) illustrates the schematic diagram of a B-B' cross-section of the actuate section 100 shown in Figs. (*a*) and (*c*). FIG. 6(*c*) illustrates a schematic diagram of the actuate section 100 shown in FIG. 6(*a*) viewed from the rear surface side. In a second embodiment, the actuate section 100 is structured on the rear surface side of the imaging surface of the image sensor 16. The actuator 100 comprises a fixed comb 104, a movable comb 505, a beam 503 and a beam fixing section 506.

In FIGS. 6(*a*)-(*c*), silicon oxide film (SiO$_2$), which is called a sacrificial layer, is selectively layered on the rear surface of the image sensor 16, which has been manufactured on the semiconductor process by using, for example, silicon as a main material; a movable substrate 502, a beam 503, a fixed comb 504, a movable comb 505 and a beam fixing section 506 are manufactured at the same time by etching a structural layer; and the movable substrate 502, the beam 503, and movable comb 505 are formed in a state so that the movable substrate 502, the beam 503, and movable comb 505 float from the rear surface of the image sensor 16 by removing the sacrificial layer by applying a sacrificial layer etching.

Namely, the movable substrate 502, the beam 503, and movable comb 505 are in a state where the movable substrate 502, the beam 503, and movable comb 505 float from the rear surface of the image sensor 16 with a space 561 between the rear surface of the image sensor 16 and the movable substrate 502, the beam 503, and movable comb 505. The movable substrate 502, the beam 503, and movable comb 505 are fixed onto the rear surface of the sensor 16 by the beam fixing section 506. Further, adhesive agent fixes the movable substrate 502 onto the fixed substrate 501. In FIG. 6(b), the movable substrate 502, fixed comb 504 and movable comb 505 are shaded.

The operation is the same as shown in FIG. 5, that is, the movable substrate 102 in FIG. 5 is to be read as a movable substrate 502 in FIG. 6, and the fixed combs 104p and 104m in FIG. 5 are to be read as fixed combs 504p and 504m in FIG. 6. When electric field E is applied between the fixed comb 504p or 504m and the movable comb 505, pull force occurs between the fixed comb 504p or 504m and the movable comb 505; the fixed comb 504p or 504m and the movable comb 505 pull each other; and the image sensor 16, onto which the fixed combs 504p and 504m are fixed, relatively moves against the fixed substrate 501, onto which the movable comb 505 has been fixed.

An embodiment of the fixed comb 504p or 504m and the movable comb 505 shown in FIG. 6(c) is an example based on the assumption that the image sensor 16 moves up and down directions (the arrow sign 6 directions) of the digital camera 1 shown in FIG. 1. The number of comb teeth of the fixed comb 504p and the movable comb 505 against the fixed comb 504p for moving the image sensor 16 against the mass of the image sensor 16 and the actuate section 100 has been set larger than the number of the comb teeth of the fixed comb 504m and the movable comb 505 for moving the image sensor 16 in the down direction, which is an action direction of the mass of the image sensor 16 and the actuate section 100.

By installing the fixed substrate 501 of a second embodiment onto the movable substrate 102 of a first embodiment shown in FIG. 2, the movement in the up and down directions of FIG. 2 can be realized by a second embodiment. Further, by realizing the movement in left and right directions of FIG. 2 by the first embodiment, the image sensor 16 can be moved in two-dimensional directions.

Further, on the image sensor 16 and the fixed substrate 501, not only the actuate section 100 described above, but also sensor members, such as a position sensor for detecting the position of the image sensor 16 against the fixed substrate 501 and the camera shake sensor 20 for detecting the shake of the digital camera 1, which are the functions that can be integrally formed on the semiconductor manufacturing process, can be structured into one body.

As described above, according to the second embodiment, by manufacturing the actuate section onto the rear surface of the image sensor, it becomes possible to further minimize the actuate section than that of a first embodiment. Further, by combining this with a first embodiment and making a second embodiment into a two-story structure, a two-dimensional actuate section can also be realized. Further, since the drive of the actuate section can be realized by only applying electric field, which is simple, the control of the actuate section is easy. Further, by optimizing the number of comb teeth in response to the load, a suitable movable capability can be obtained.

Figure 7A:
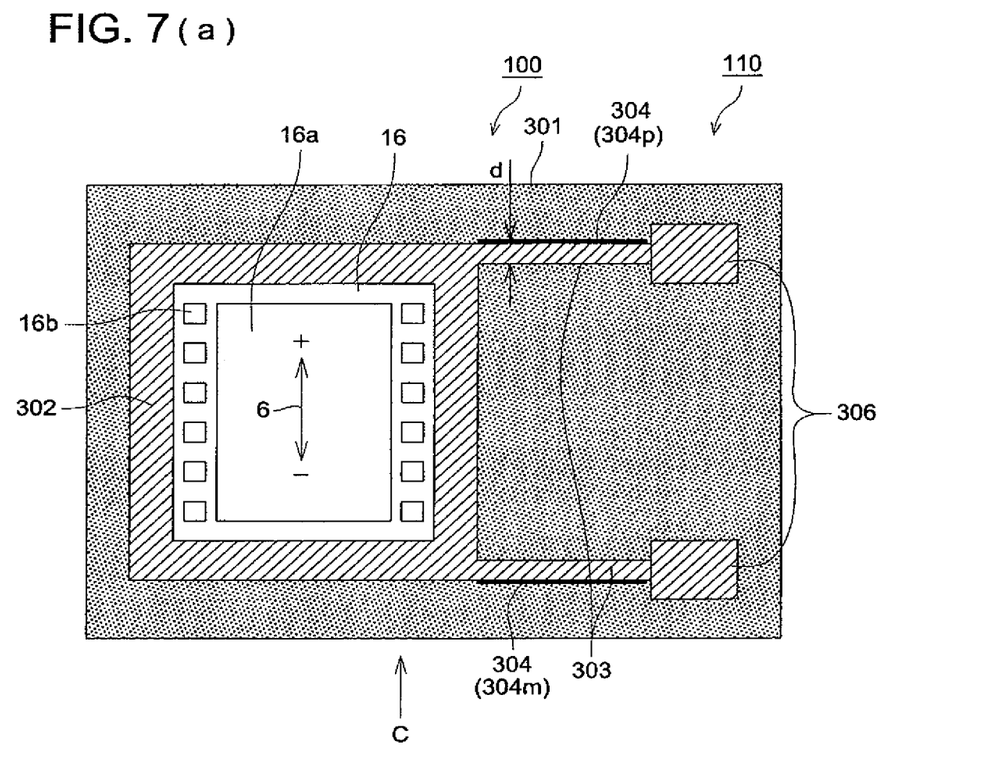
Figure 7B:
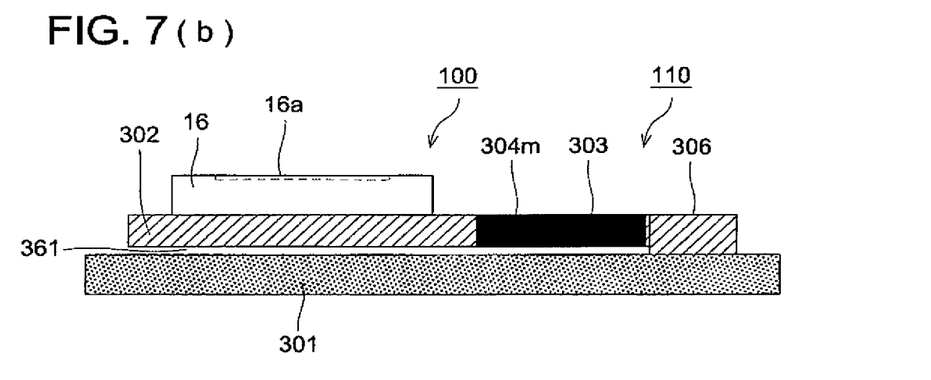

Next, a third embodiment of the actuate section 100 will be described by using FIG. 7. FIG. 7 illustrates a schematic diagram showing the structure of a third embodiment of the actuate section 100. FIG. 7(a) shows a front view of the actuate section 100 viewed from an imaging surface 16a of the image sensor 16. FIG. 7(b) show a side view of the actuate section 100 viewed from an arrow sign C side.

In a first embodiment and a second embodiment described above, the actuate section utilizing the electro static force generated between the fixed comb 104 or 504 and the movable comb 105 or 505 has been disclosed. However, the actuate section is not limited to this. The actuate section 100 may be structured by using the other driving mechanism, which can be formed by the MEMS technique. Hereinafter, an actuate section utilizing piezoelectric effect of a piezoelectric thin film will be described.

The image sensor 16 manufactured on the semiconductor process by using, for example, silicon (Si) as a main material, is installed and contacted with a movable substrate 302 structured by silicon (Si) as a main material, into which extrinsic material has been doped with a high concentration, by a method of a direct contact technique or adhesion. Two beams 303 having foot-shape are provided with the movable substrate 302. The movable substrate 302 and the beams 303 are fixed by the beam fixing section 306 onto the fixed substrate 301 with a minute space 361 between the movable substrate 302 and the beam 303, and the fixed substrate 301.

The fixed substrate 301 structured by silicon (Si). Piezoelectric thin films 304 are respectively formed on the two pieces of beams 303 of the movable substrate 302. With respect to the method of forming the piezoelectric thin films, there are a spattering method, a CVC method and a Sol-Gel processing. In a third embodiment, an actuator 110 comprises the beams 303, the beam fixing section 306 and the Piezoelectric thin films 304. The piezoelectric thin'films 304 work as a piezoelectric material in this invention. The piezoelectric material is not limited to the piezoelectric thin film, and it may be a piezoelectric actuator having a single layer or multi-layers.

The actuate section 100 and image sensor 16, which have been shown in FIG. 7, are installed on the die-frame 205 in the package 203 as the same as shown in FIGS. 2-4. After being wire-bonded, the actuate section 100 and image sensor 16 are sealed in the same space formed by the package 203, the protective glass 204 and the lens 41.

Further, electrodes are formed on the surface of the piezoelectric thin films 304. The movable substrate 302 is highly doped with extrinsic material. The movable substrate 302 has conductivity. The beam fixing section 306 is grounded. Since there is no intermediate material, such as adhesive agent, between the beam 303 and the piezoelectric thin films 304, the beam 303 plays a role as a common electrode of the piezoelectric thin films 304.

Here, the piezoelectric thin film 304 positioned in "+" side of the arrow sign 6 in FIG. 6 is to be a + side piezoelectric thin film 304p, and the piezoelectric thin film 304 positioned in "−" side of the arrow sign 6 is to be a − side piezoelectric thin film 304p. When applying negative voltage onto the electrodes of the + side piezoelectric thin film 304p, since the + side piezoelectric thin film 304p shrinks in the direction perpendicular to the arrow sign 6 direction, the beam 303 is bent in the right side in FIG. 7(a) and the movable substrate 302 moves to the + direction. At this case, it is assured that the beam 303 moves only in the direction of the arrow sign 6 of the movable substrate 302. When stopping the application of the voltage to the + side piezoelectric thin film 304p, the movable substrate 302 returns to the original position by the righting force of the beam 303. Since the width "d" of the beam 303 is several μm to several tens μm, which is relatively thin, driving power of the piezoelectric thin film 304 can be enough to drive the movable substrate 302.

Next, when applying a negative voltage onto the – side piezoelectric thin film 304, since the – side piezoelectric thin film 304 shrinks in the direction perpendicular to the arrow sign 6 direction, the beam 303 is bent in the left side of FIG. 7(a) and the movable substrate 302 moves in a – side direction. In this case, it is also assured that the beam 303 moves only in the arrow sing 6 direction of the movable substrate 302. When stopping the application of the voltage to the – side piezoelectric thin film 304m, the movable substrate 302 returns to the original position by the righting force of the beam 303.

In a third embodiment, an example where a piezoelectric thin film is used in the actuate section. However, instead of the piezoelectric thin film, shape memory alloys (SMA) described above or a polymer actuator can be used. In this case, the operation of the actuate section may be controlled by the current when applying current for heating (in the case of shape memory alloys) or by the application of electric field for deforming the polymer (in the case of the polymer actuator) by forming the thin film of shape memory alloys (SMA) or the thin film of a polymer actuator at the place where the piezoelectric this film 304 is located in FIG. 7.

In a third embodiment, the movable substrate 302, the beam 303 and the beam fixing section 306 are structured by using silicon (Si) as a main material by applying HEMS technique. However, it is not limited to this mythology. For example, these may be structured by etching a metal plate.

As described above, according to a third embodiment, a small sized actuate section 100 having a simple configuration where the movable substrate 302 including the beam 303 is fixed onto the fixed substrate 301 and the piezoelectric thin film 304 is formed on the beam 303 can be realized. With regard to the drive of the actuate section 100, since it can be controlled just by applying the voltage on the piezoelectric thin film 304, it is simple and also easy to control.

Figure 8:
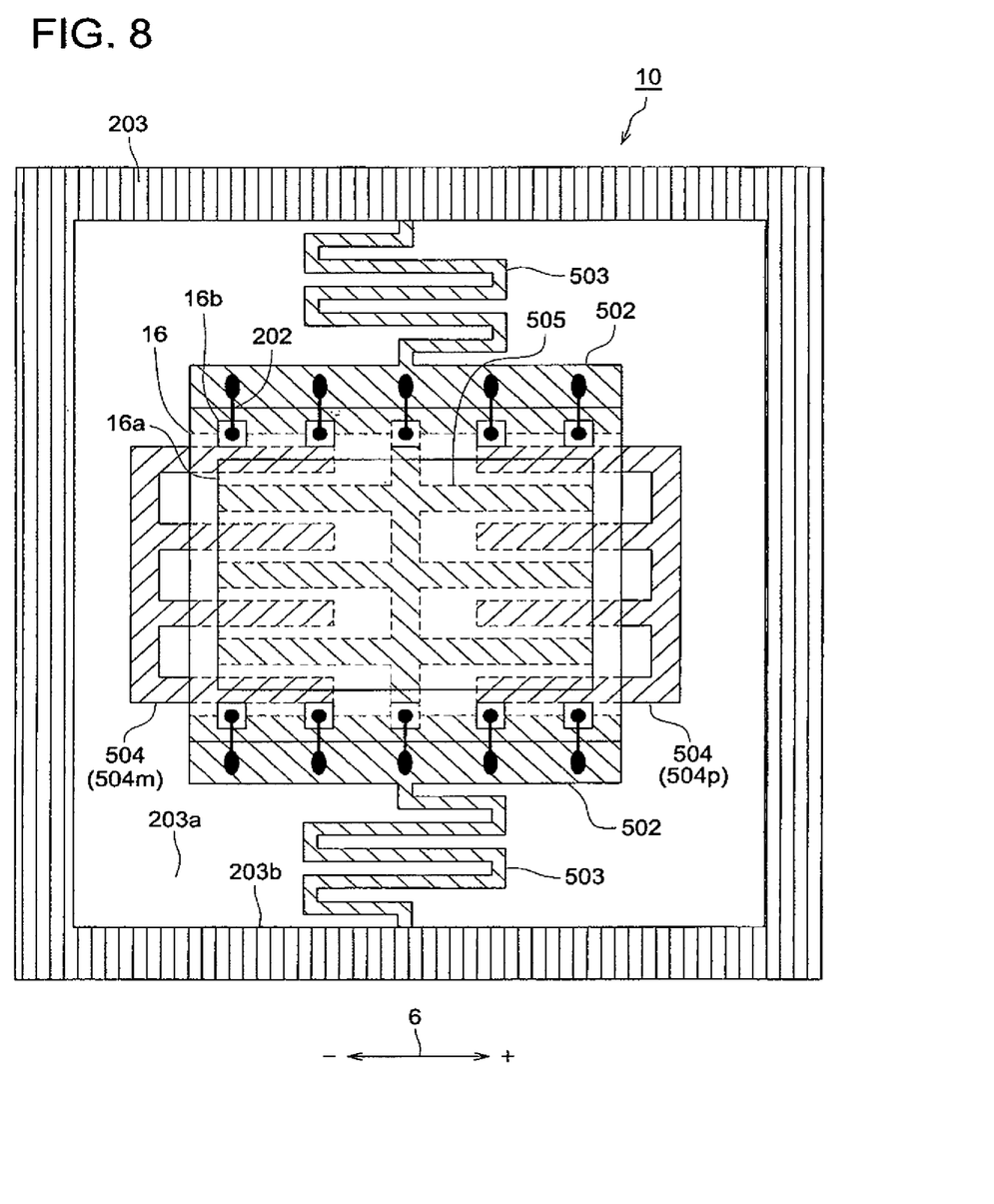
FIG. 8 illustrates a schematic diagram showing a fourth embodiment of the actuate section.

Next, a fourth embodiment of an actuate section 100 will be detailed while referring to FIG. 8. FIG. 8 illustrates a schematic diagram showing a fourth embodiment of the actuate section.

In the first embodiment, since the image sensor 16 and the lead frame 201 are directly connected by the bonding wire 202, when the image sensor 16 moves, the bonding wire 202 is vibrated, which must be controlled. However, such control is not necessary in the fourth embodiment, which will be detailed below.

In the fourth embodiment, the actuate section 100 is formed on a rear surface of an imaging surface 16a, which is the same as the second embodiment shown in FIG. 6, and an actuator 110 is structured of fixed combs 504, a movable comb 505 and a beam 503.

In FIG. 8, a movable substrate 502 and the movable comb 505 are adhered on the rear surface of the imaging surface 16a of the image sensor 16, which is reverse to the case of FIG. 6. Two helical beams 503 protrude from the movable substrate 502, in opposite directions with each other, and connected to an inner surface 203b of a package 203. That is, the image sensor 16 is supported in the package 203 by the movable substrate 502 and the beam 503, at the positions where the helical beams 503 connect to the inner surface 203b of the package 203.

On the other hand, fixed combs 504b and 504p are floated from the rear surface of the imaging surface 16a of the image sensor 16, but they are fixed to a bottom 203a of the package 203. The forming methods of the movable substrate 502, the movable comb 505, the beam 503 and the fixed comb 504 are the same as those detailed in FIG. 6.

The operations are the same as those detailed in FIG. 5, that is, when applying the electric field E between the fixed comb 504p or 504m and the movable comb 505, a pull force caused by the electro static power between the fixed comb 504p or 504m and the movable comb 505 is generated, whereby the fixed comb 504p or 504m and the movable comb 505 pull each other. Due to this, the positional relationship between the image sensor 16 carrying the movable comb 502 and the package 203 carrying the fixed comb 504 changes, so that the image sensor 16 moves in the direction shown by arrow 6.

Each signal of the image sensor 16 is sent from bonding pad 16b to an un-illustrated bonding pad on the movable substrate 502 through a bonding wire 202, and is sent to a terminal provided on the package 203, from the position where the beam 503 connects to the inner surface 203b of the package 203, through un-illustrated wirings on the beam 503.

As described above, based on the fourth embodiment, the effects which are the same as those described in the second embodiment can be obtained. Further, since the bonding wire 202 connects the image sensor 16 and the movable substrate 502 moving with the image sensor 16, the bonding wire 202 is prevented from the vibration, while the image sensor 16 moves. Accordingly, it is not necessary to reinforce the bonding sections by potting, which is applied in the first embodiment.

Figure 9:
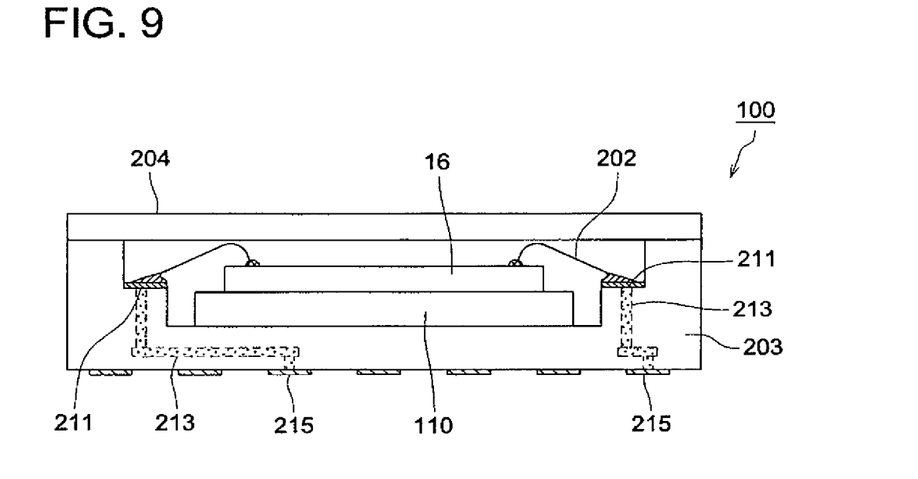
FIG. 9 illustrates a schematic view showing an alternative method of the electrical connecting member.

Next, an alternating method of the external electrical connecting member of the present invention will be "detailed" while referring to FIG. 9.

FIG. 9 illustrates a schematic view showing the alternative method of the external electrical connecting member. An image sensor 16 is mounted on an actuator 110 of an actuate section 100, mounted in a package 203. Both the actuator 110 and the image sensor 16 are sealed in a package 203.

Each signal of the image sensor 16 is sent from bonding pad 16b to a bonding pattern 211 of the package 203 through a bonding wire 202, and is sent to a terminal 215 provided on the bottom of the package 203, through a signal line 213 mounted in package 203. In this case, the bonding pattern 211, the signal line 213 and the terminal 215 serve as the external electrical connecting member of the present invention.

As just described, by a method other than the method using the lead frame 201 shown in FIGS. 2-4, the image sensor 16 can be electrically connected to the outside of the package 203.

As described above, according to this invention, by sealing the image sensor and the actuate section for moving the image sensor into the same space, an image sensor unit, which is suitable for the installation into a small size camera module and an optical pickup, and which is small sized, easy to be assembled and free from influence of foreign objects, can be provided.

With respect to the detailed configurations and operations of respective elements structuring the image sensor unit and the image sensor apparatus, various changes and modifications may be made without departing from the scope of this invention.

EFFECT OF THIS INVENTION

According to this invention, by sealing the image sensor and the actuate section for moving the image sensor into the same space, an image sensor unit, which is suitable for the installation into a small size camera module and an optical pickup, small sized, easy to be manufactured and free from influence of foreign objects, can be provided.

What is claimed is:

1. An image sensor unit comprising:
    a fixed substrate,
    a movable substrate,
    an actuate section including an actuator for moving the movable substrate against the fixed substrate,
    an image sensor having an imaging surface on a front surface of the image sensor, and at least, a part of a rear surface of the image sensor being directly fixed onto the movable substrate,
    an external electrical connecting member for conducting a transmission and reception of signals between the actuate section or the image sensor and outside of the image sensor unit, and
    an internal electrical connecting member for electrically connecting the actuate section or the image sensor to the external electrical connecting member,
    wherein the actuate section, the image sensor, the internal electrical connecting member and a part of the external connecting member are sealed into a same space, and
    wherein an entirety of the actuator is provided on the rear surface of the image sensor.

2. The image sensor unit of claim 1, wherein the same space comprises:
    a package for storing the actuate section, the image sensor, the internal electrical connecting member and a part of the external connection wiring, and
    an optical member provided on the package for guiding light to the imaging surface.

3. The image sensor unit of claim 1, wherein the optical member is formed by protective glass.

4. The image sensor unit of claim 2, wherein the optical member is a lens positioned at a point, which is closest to the image sensor among parts configuring a photographic optical system for forming an image of an object on the imaging surface.

5. An image sensor unit comprising:
    a fixed substrate,
    a movable substrate,
    an actuate section including an actuator for moving the movable substrate against the fixed substrate,
    an image sensor having an imaging surface on a front surface of the image sensor, and at least, a part of a rear surface of the image sensor being directly fixed onto the movable substrate,
    an external electrical connecting member for conducting a transmission and reception of signals between the actuate section or the image sensor and outside of the image sensor unit, and
    an internal electrical connecting member for electrically connecting the actuate section or the image sensor to the external electrical connecting member,
    wherein the actuate section, the image sensor, the internal electrical connecting member and a part of the external connecting member are sealed into a same space, and
    wherein the internal connecting member is a bonding wire, which is loosed with a length, which is equal to or more than a half of a maximum moving length of the image sensor against the external connecting member.

6. The image sensor unit of claim 5, wherein the bonding wire is drawn in a direction, which is perpendicular to a direction, in which the image sensor moves against the external electrical connecting member.

7. The image sensor unit of claim 5, wherein reinforcement is applied onto a contact point of the bonding wire and the external connecting member.

8. The image sensor unit of claim 1, wherein, the actuator comprises:
    a fixed comb fixed onto the fixed substrate,
    a movable comb, which is structured so that the movable comb and the fixed comb are arranged in a zigzag structure,
    a beam formed into one body together with the movable substrate, and
    a beam fixing section for fixing a part of the beam onto the fixed substrate,
    wherein the movable substrate is arranged to move against the fixed substrate based on pull force generated between the fixed comb and the movable comb by applying electric field between the fixed comb and the movable comb.

9. The image sensor unit of claim 8, wherein a number of the fixed comb and a number of movable comb are arranged to be different between a moving direction, into which the image sensor moves against a mass of the image sensor, and a moving direction, into which the image sensor moves according to an action of mass of the image sensor.

10. The image sensor unit of claim 1, wherein the actuator comprises:
    a beam, which has been formed into one body together with the movable substrate,
    a beam fixing section for fixing a part of the beam onto the fixed substrate, and
    a piezoelectric material formed into the beam.

11. The image sensor unit of claim 1, wherein the actuator comprises:
    a beam, which has been formed into one body together with the movable substrate,
    a beam fixing section for fixing a part of the beam onto the fixed substrate, and
    a shape memory alloy formed into the beam.

12. The image sensor unit of claim 1, wherein the actuator comprises:
    a beam, which has been formed into one body together with the movable substrate,
    a beam fixing section for fixing a part of the beam onto the fixed substrate, and
    a polymer actuator formed into the beam.

13. An image sensor apparatus comprises a photographic optical system and the image sensor unit of claim 1.

* * * * *